(12) United States Patent
Engelhardt

(10) Patent No.: US 10,043,683 B2
(45) Date of Patent: Aug. 7, 2018

(54) PLASMA SYSTEM, CHUCK AND METHOD OF MAKING A SEMICONDUCTOR DEVICE

(71) Applicant: Infineon Technologies AG, Neubiberg (DE)

(72) Inventor: Manfred Engelhardt, Villach-Landskron (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/358,962

(22) Filed: Nov. 22, 2016

(65) Prior Publication Data

US 2017/0076962 A1 Mar. 16, 2017

Related U.S. Application Data

(62) Division of application No. 13/543,701, filed on Jul. 6, 2012, now Pat. No. 9,530,618.

(51) Int. Cl.
| | |
|---|---|
| *C23C 16/00* | (2006.01) |
| *H01L 21/67* | (2006.01) |
| *H01L 21/683* | (2006.01) |
| *H01J 37/32* | (2006.01) |

(52) U.S. Cl.
CPC .. *H01L 21/67069* (2013.01); *H01J 37/32091* (2013.01); *H01J 37/32165* (2013.01); *H01J 37/32532* (2013.01); *H01J 37/32541* (2013.01); *H01J 37/32724* (2013.01); *H01L 21/6831* (2013.01); *H01J 2237/332* (2013.01); *H01J 2237/3341* (2013.01); *Y10T 279/21* (2015.01)

(58) Field of Classification Search
None
See application file for complete search history.

(56) References Cited

U.S. PATENT DOCUMENTS

| | | | |
|---|---|---|---|
| 5,561,585 A | 10/1996 | Barnes et al. | |
| 5,904,799 A | 5/1999 | Donohoe | |
| 6,042,686 A | 3/2000 | Dible et al. | |
| 6,088,213 A | 7/2000 | Herchen | |
| 6,281,469 B1 | 8/2001 | Perrin et al. | |
| 6,648,976 B1 | 11/2003 | Matsuda et al. | |
| 6,977,722 B2 * | 12/2005 | Wohlstadter | B01L 3/5085 356/246 |
| 7,842,246 B2 * | 11/2010 | Wohlstadter | B01L 3/5085 422/401 |
| 7,981,362 B2 * | 7/2011 | Glezer | B01L 3/5085 422/50 |
| 8,361,385 B2 * | 1/2013 | Glezer | B01L 3/5085 422/50 |
| 8,790,578 B2 * | 7/2014 | Wohlstadter | B01L 3/5085 422/50 |

(Continued)

FOREIGN PATENT DOCUMENTS

JP 2008193024 A 8/2008

*Primary Examiner* — Telly Green
(74) *Attorney, Agent, or Firm* — Slater Matsil, LLP

(57) ABSTRACT

A chuck, a system including a chuck and a method for making a semiconductor device are disclosed. In one embodiment the chuck includes a first conductive region configured to be capacitively coupled to a first RF power generator, a second conductive region configured to be capacitively coupled to a second RF power generator and an insulation region that electrically insulates the first conductive region from the second conductive region.

21 Claims, 6 Drawing Sheets

(56) References Cited

U.S. PATENT DOCUMENTS

| | | | |
|---|---|---|---|
| 8,808,627 B2 * | 8/2014 | Wohlstadter | B01L 3/5085 422/50 |
| 8,845,963 B2 * | 9/2014 | Glezer | B01L 3/5085 422/50 |
| 9,034,263 B2 * | 5/2015 | Wohlstadter | B01L 3/5085 422/82.01 |
| 9,664,613 B2 * | 5/2017 | Wohlstadter | G01N 21/253 |
| 2004/0022677 A1 * | 2/2004 | Wohlstadter | B01L 3/5085 422/52 |
| 2005/0052646 A1 * | 3/2005 | Wohlstadter | B01L 3/5085 356/311 |
| 2005/0142033 A1 * | 6/2005 | Glezer | B01L 3/5085 422/400 |
| 2005/0272227 A1 | 12/2005 | Moriya et al. | |
| 2006/0254717 A1 | 11/2006 | Kobayashi et al. | |
| 2009/0065349 A1 | 3/2009 | Kim et al. | |
| 2009/0242515 A1 | 10/2009 | Honda et al. | |
| 2011/0059870 A1 * | 3/2011 | Wohlstadter | B01L 3/5085 506/39 |
| 2011/0203924 A1 * | 8/2011 | Wohlstadter | B01L 3/5085 204/403.01 |
| 2011/0241547 A1 | 10/2011 | Wei | |
| 2011/0269642 A1 * | 11/2011 | Glezer | B01L 3/5085 506/9 |
| 2012/0190590 A1 * | 7/2012 | Wohlstadter | B01L 3/5085 506/39 |
| 2012/0190591 A1 * | 7/2012 | Wohlstadter | B01L 3/5085 506/39 |
| 2012/0322270 A1 | 12/2012 | Long et al. | |
| 2013/0203620 A1 * | 8/2013 | Glezer | B01L 3/5085 506/9 |

* cited by examiner

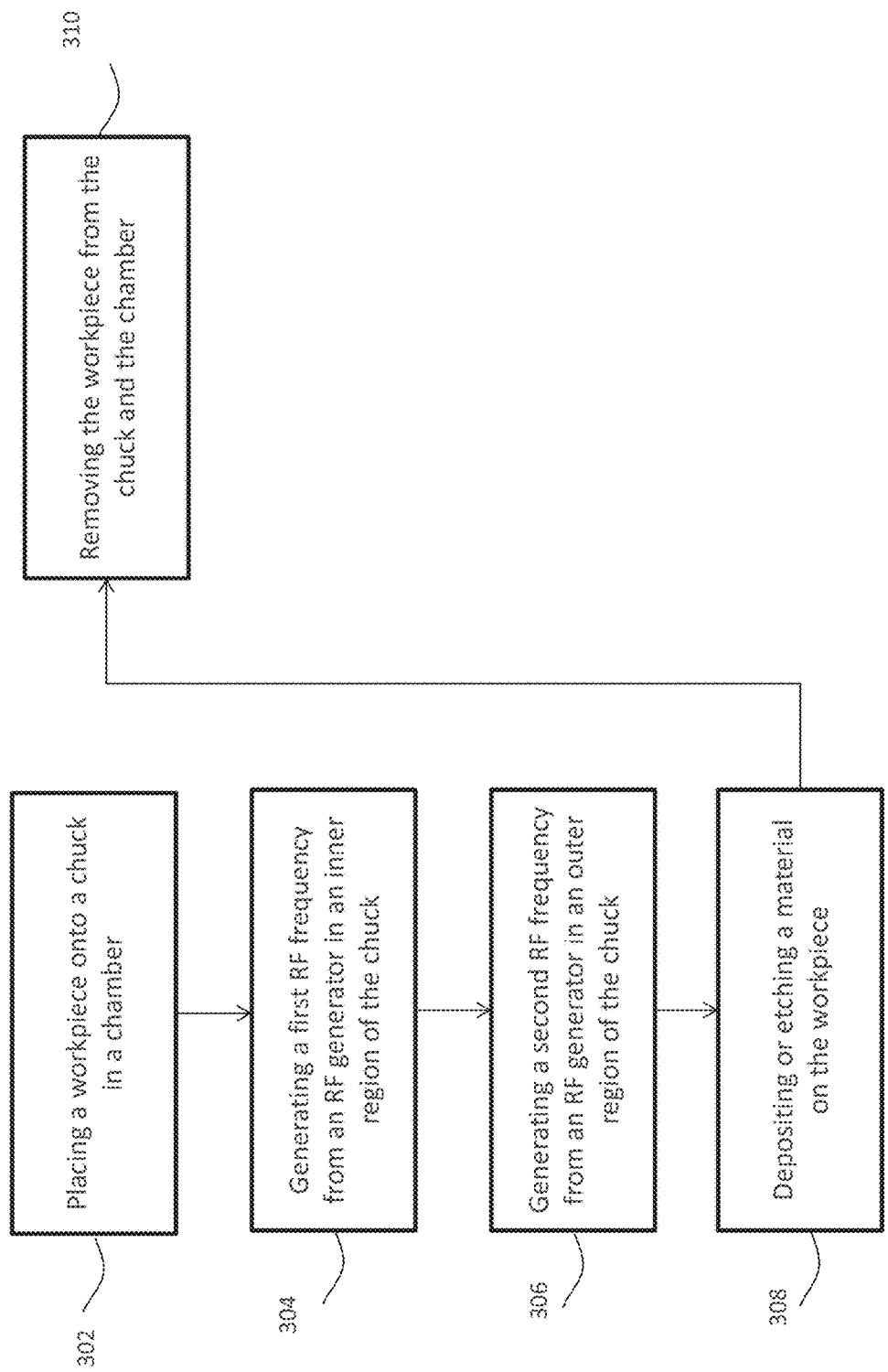

PLASMA SYSTEM, CHUCK AND METHOD OF MAKING A SEMICONDUCTOR DEVICE

CROSS-REFERENCE TO RELATED APPLICATIONS

This application is a Divisional of U.S. patent application Ser. No. 13/543,701, filed on Jul. 6, 2012, which application is hereby incorporated herein by reference.

TECHNICAL FIELD

The present invention relates generally to a plasma system, a chuck and a method of making a semiconductor device.

BACKGROUND

A typical (parallel plate) RIE system consists of a cylindrical vacuum chamber, with a chuck located in the bottom portion of the chamber. The wafer platter is electrically insulated from the rest of the chamber. Gas enters through small inlets in the top of the chamber, and exits to the vacuum pump system through the bottom.

Another type of an RIE system is an inductively coupled plasma (ICP) RIE. In the ICP RIE system, the plasma is generated with an RF powered magnetic field. Very high plasma densities can be achieved, though etch profiles tend to be more isotropic.

A combination of parallel plate and inductively coupled plasma RIE system is possible. In the combined system, the ICP is employed as a high density source of ions which increases the etch rate, whereas a separate RF bias is applied to the silicon wafer on the chuck to create directional electric fields near the silicon wafer to achieve more anisotropic etch profiles.

SUMMARY

In accordance with an embodiment of the present invention, a chuck comprises a first conductive region configured to be capacitively coupled to a first RF power generator, a second conductive region configured to be capacitively coupled to a second RF power generator and an insulation region that electrically insulates the first conductive region from the second conductive region.

In accordance with an embodiment of the present invention, a system comprises a plasma chamber and a first electrode located in the plasma chamber. The system further comprises a second electrode located in the plasma chamber and configured to receive a workpiece, wherein the second electrode comprises a first conductive region and a second conductive region that is electrically insulated from the first conductive region, wherein the first conductive region is configured to receive a first RF power and the second conductive region is configured to receive a second RF power.

In accordance with an embodiment of the present invention, a method comprises placing a workpiece on a chuck, the chuck being located in a plasma chamber, applying a first power signal to a first conductive region of the chuck, the first power signal having a first power signal characteristic and applying a second power signal to a second conductive region of the chuck, the second power signal having a second power signal characteristic that is different than the first power signal characteristic. The method further comprises while the first and second power signals are applied, etching the workpiece or depositing a material on the workpiece and removing the workpiece from the chuck.

BRIEF DESCRIPTION OF THE DRAWINGS

For a more complete understanding of the present invention, and the advantages thereof, reference is now made to the following descriptions taken in conjunction with the accompanying drawings, in which:

FIG. 6 shows a method of manufacturing a semiconductor device.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely capacitively coupled plasma systems. The present invention may also be applied, however, to other plasma systems, etch systems, deposition systems, or cleaning systems. Moreover, the present invention may be applied to any plasma etch tool, plasma assisted deposition tool, plasma assisted cleaning tool or plasma doping tool where the chuck or wafer chuck is powered, e.g., connected to an RF power generator.

Figure 1:
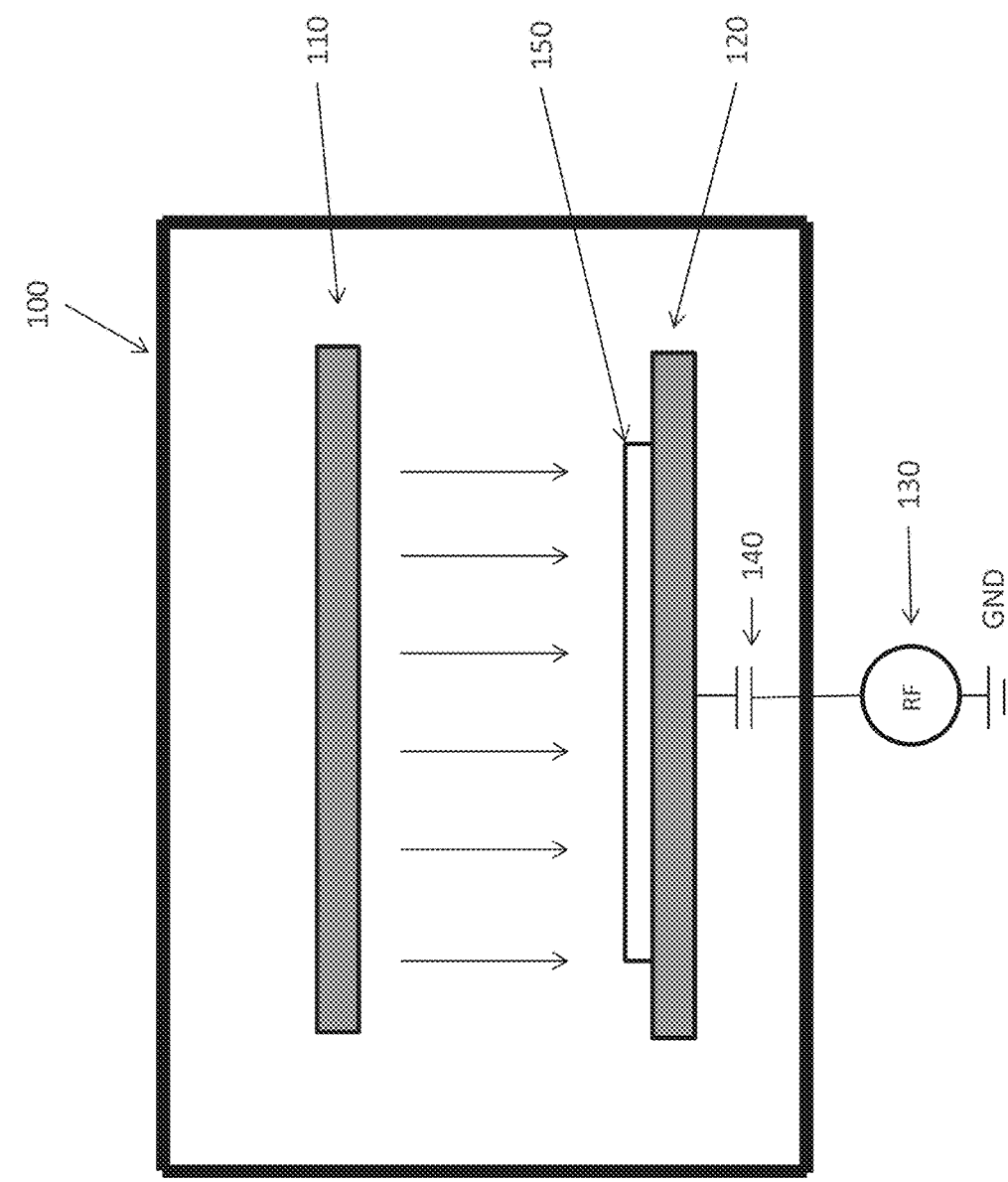
FIG. 1 shows an etch system with a conventional wafer chuck.

FIG. 1 shows a conventional capacitively coupled plasma (CCP) system boo. The system comprises an upper electrode no and a lower electrode 120. The lower electrode 120 may be a wafer chuck. The CCP system is driven by a single radio-frequency (RF) power supply 130. The lower electrode 120 is insulated relative to ground typically with a coupling capacitor 140. In operation a wafer 150 is placed on the wafer chuck 120, an electrical field is applied between the two electrodes and the wafer 150 is etched using the CCP system 100.

A problem with conventional capacitively coupled plasma system is that it does not provide uniform etch rates or uniform deposition rates over the entire wafer. For example, the wafer may be etched or a material may be deposited differently in a center area of the wafer where chips have neighboring chips on all sides than in an edge area of the wafer where chips do not have neighboring chips on all sides.

Therefore, a plasma system is needed in the art in which the deposition rates of a material or the etch rates of the wafer is more uniform over the entire wafer.

An embodiment of the invention provides a segmentation of a wafer chuck in a first region and a second region, wherein the first region is coupled to a first RF generator and wherein the second region in coupled to a second RF generator. An embodiment of the invention provides a segmentation of a wafer chuck in a first region and a second region, wherein the first region is configured to receive a first RF power and wherein the second region is configured to receive a second RF power. An advantage may be that the application of different RF powers improve the uniformity of deposition rates of materials or etch rates of the wafer in the plasma deposition system.

Figure 2:
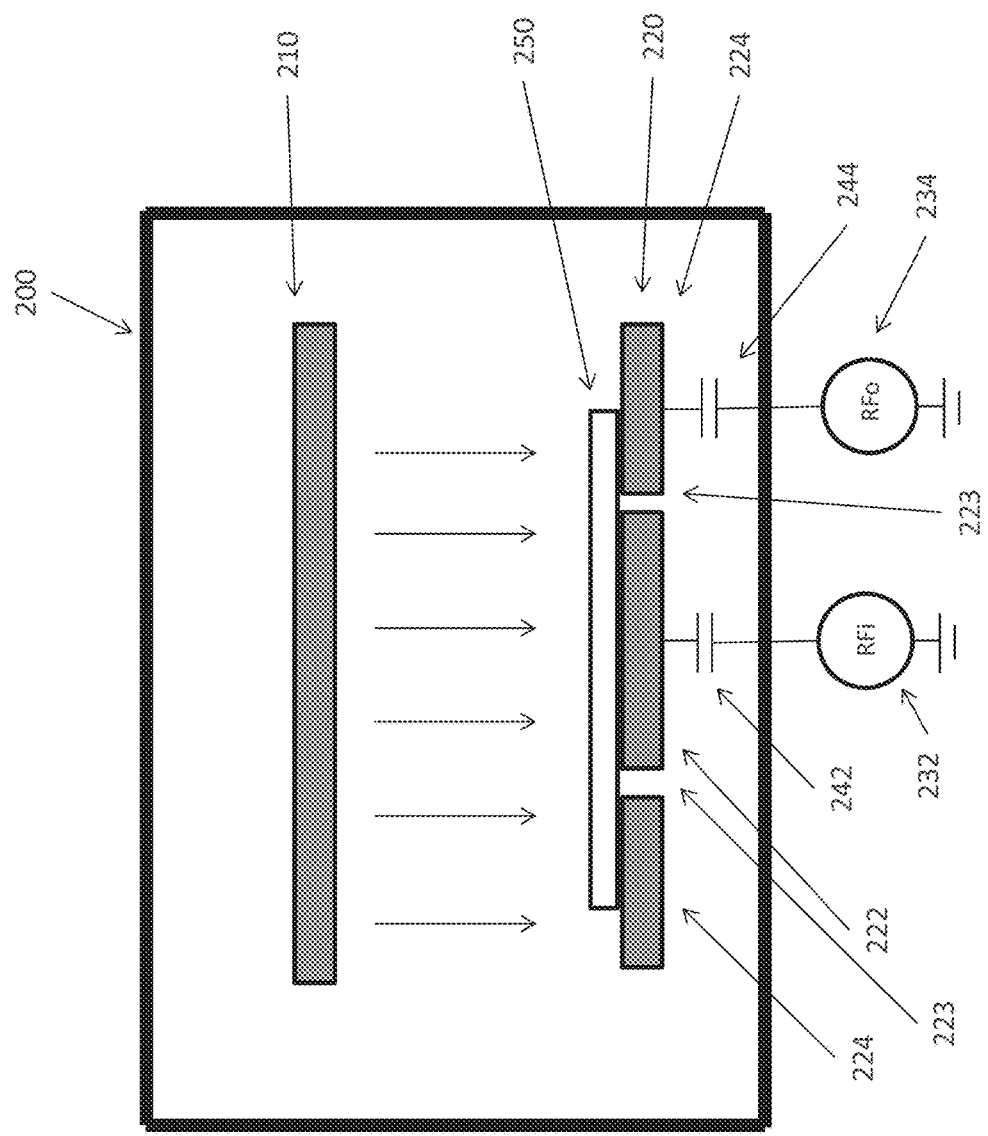
FIG. 2 shows an etch system with an embodiment of a wafer chuck.

FIG. 2 shows an embodiment of a plasma chamber or plasma system 200. A first electrode 210 is arranged in an upper portion of the chamber 200 and a second electrode or wafer chuck 220 is arranged in a lower portion of the chamber 200. The wafer chuck 220 comprises a first region or inner region 222 and a second region or outer region 224. The first region 222 may be disk shaped. Alternatively, the first region 222 may comprise other suitable geometrical forms. The second region 224 may be annular shaped or frame like shaped or may be a concentric ring enclosing the disk. Alternatively, the second region 224 may comprise other suitable geometrical forms. A workpiece 250 may be located on the wafer chuck 220.

The wafer chuck 200 further comprises an insulation region 223 electrically insulating the first region 222 from the second region 224. The insulation region 223 may comprise an insulation material, e.g., dielectric material, air or ceramic.

The first region 222 is electrically connected to an electrical potential such as ground (GND) via a first DC voltage insulator 242 and the second region 224 is electrically connected to an electrical potential such as ground (GND) via a second a second voltage insulator 244. The first DC voltage insulator 242 and the second voltage insulator may be coupling capacitances or other DC insulator devices such as a galvanic insulator. The first and the second coupling capacitances 242, 244 may be the same or may be different. The first and second coupling capacitances 242, 244 may be part of a fully automated matching network including a feedback loop. The coupling capacitances 242, 244 are typically the same. In some embodiments, when the power requirements of the two regions are highly different, the coupling capacitances 242, 244 may be different.

The first region 222 is electrically connected to a first RF power generator $RF_i$ 232, and the second region 224 is electrically connected to a second RF power generator $RF_o$, 234. The first and second RF power generators 232, 234 maybe RF power generators. The power generator may operate in the radio frequency (RF) spectrum, e.g., in the range between about 3 MHz to about 300 GHz. The first RF power generator $RF_i$ 232 may generate a first power signal having a first power signal characteristic. The first power signal characteristic comprises a first power, a first frequency and/or a first phase. The second RF power generator $RF_o$, 234 may generate a second power signal having a second power signal characteristic. The second power signal characteristic comprises a second power, a second frequency, and/or a second phase. In one embodiment, the first power signal and the second power signal comprise the same frequency and the same phase but different powers.

The first power generator $RF_i$ 232 may comprise an output power between 100 W and 2000 W, or alternatively, an output between 500 W and 1000 W. The second power generator $RF_o$ 234 may comprise an output power between 300 W and 2000 W, or alternatively, an output between 500 W and 1000 W. The first power generator $RF_i$ 232 and the second power generator $RF_o$ 234 may comprise the same output power or different output powers. The first power generator $RF_i$ 232 may comprise a higher output power than the second power generator $RF_o$ 234. Alternatively the second power generator $RF_o$ 234 may comprise a higher output power than the first power generator $RF_i$ 232. For example, the output power of the first power generator $RF_i$ 232 may be 80-90% of the output power of the second power generator $RF_o$ 234. Alternatively, the output power of the second power generator $RF_o$ 234 may be 80-90% of the output power of the first power generator $RF_i$ 232.

In one embodiment the first region 222 is configured to be heated to a first temperature and the second region 224 is configured to be heated to a second temperature. The first region 222 may be heated to a higher temperature than the second region 224. Alternatively, the second region 224 may be heated to a higher temperature than the first region 222. For example, the first region 222 of the wafer chuck 220 may be connected to a first heater and the second region 224 may be connected to a second heater.

The wafer chuck 220 may comprise more than two regions, i.e., a plurality of regions which are all insulated from each other. For example, the wafer chuck 220 may comprise an additional third region. In one embodiment, the third region is a concentric ring or a ring shaped third region disposed laterally adjacent to the second region 224. The third region is insulated from the second region 224 by a second insulation region. The second insulation region may comprise the same material or a different material than the first insulation region 223. The third region is electrically connected via a coupling capacitance and a third RF power generator to an electrical potential such as ground. In one embodiment, the third region is configured to be heated to a third temperature.

Figure 3:
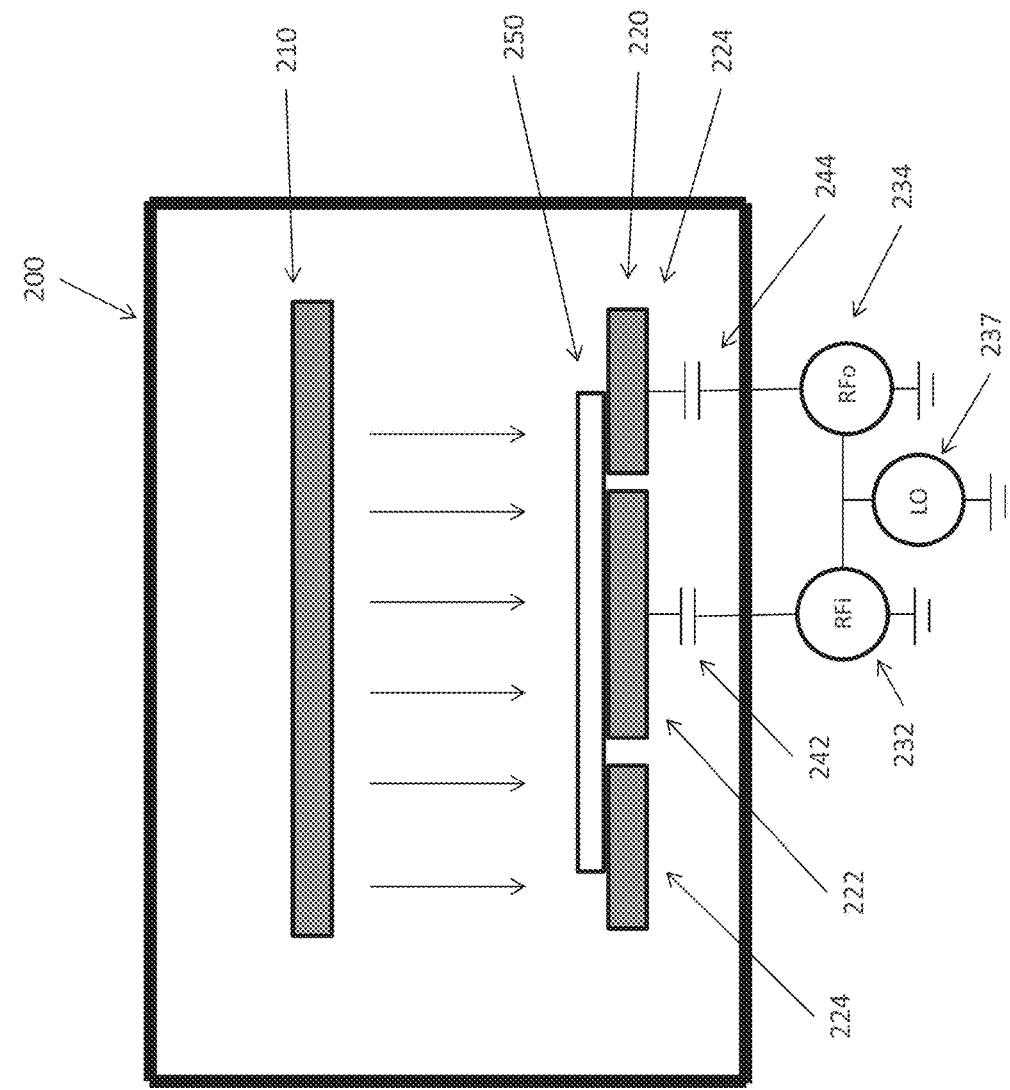
FIG. 3 shows an etch system with an embodiment of a wafer chuck.

The embodiment of FIG. 3 shows a plasma chamber comprising a wafer chuck 220. The wafer chuck 220 of FIG. 3 comprises the same or similar components than the one of FIG. 2. The first region 222 and the second region 224 are each powered with a first power generator 232 and a second power generator 234, respectively. The first power generator 232 and the second power generator 234 are connected to a common local oscillator (LO) 237. The LO 237 may be a variable frequency oscillator. The LO 237 drives the first power generator 232 and the second power generator 234 by providing both generators with the same frequency and the same phase. In one embodiment the first power generator 232 and the second power generator 234 are merely amplifiers amplifying the power received from the LO 237. The first amplifier (first power generator) may amplify the LO 237 signal to a different power than the second amplifier (second power generator). In the embodiment where the wafer chuck 200 may comprises a plurality of regions and each region is electrically connected to a power generator, each power generator is connected to the common local oscillator (LO) 237.

Figure 4:
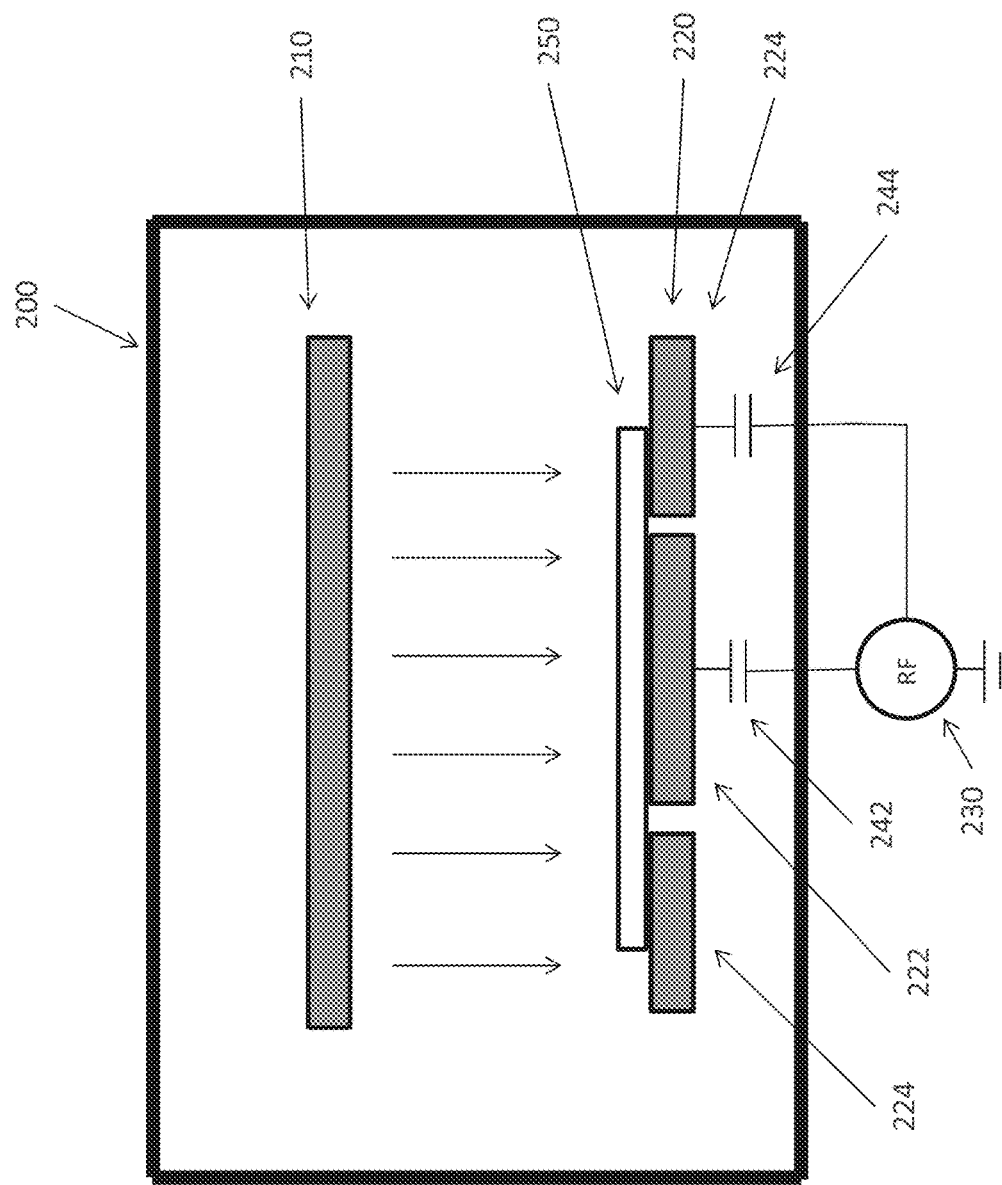
FIG. 4 shows an etch system with a further embodiment of a wafer chuck.

The embodiment of FIG. 4 shows a plasma chamber comprising a wafer chuck 220. The wafer chuck 220 of FIG. 4 comprises the same or similar components than the one of FIG. 2. The wafer chuck 220 comprises a first region 222 and a second region 224. The first region 222 of the wafer chuck 220 and the second region 224 of the wafer chuck 220 are each coupled to the same power generator 230. In one embodiment the power generator 230 may comprise a power splitter. The power splitter may split the power of the power generator 230 so that a first amount of power is directed to the first region 222 and that a second amount of power is directed to the second region 224. For example, the power splitter may split the power in a 50/50% ratio, in a 60/40% ratio, or in a 40/60% ratio. For the embodiment with a plurality of regions, the power splitter may split the power in other ratios.

An embodiment may comprise a system having more than two regions or zones, such as three or four regions, connected via more than two capacitors, such as three or four capacitors, to more than two RF generators, such as three or four RF generators.

Figure 5:
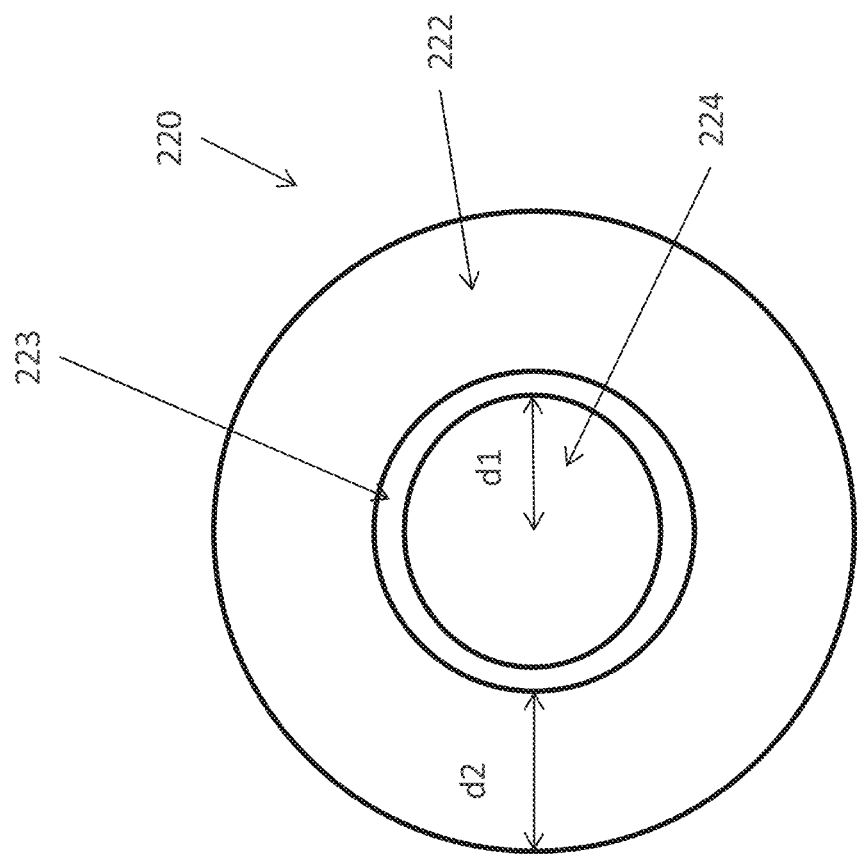
FIG. 5 illustrates an embodiment of a top view of a wafer chuck.

FIG. 5 shows a top view of a wafer chuck 220. The wafer chuck 220 comprises a first region 222 and a second region 224. The first region 222 is insulated from the second region 224 via an insulation region 223. The first region 222 is disk shaped and the second region is ring shaped. The insulation region 223 concentrically spaces the disk shaped region 222 from the ring shaped region 224.

The first region 222 may comprise a first distance $d_1$ from a center point of the first region to a point at the circumference of the first region 222. The second region 224 may comprise a second distance $d_2$ from a point at the inner circumference to a point at the outer circumference. In one example, the first distance $d_1$ may be the same as the second distance $d_2$. Alternatively, the first distance $d_1$ may be different than the second distance $d_2$. The first and second distances may be radii.

The wafer chuck 220 comprises an insulation region 223 between the first region and the second region. The insulation region 223 may comprise an insulation material, e.g., dielectric material, air or ceramic. The insulation region 223 may evenly space the first region 222 from the second region 224.

In the embodiment with more than two regions, the first, second and third regions all have the same distances. Alternatively, the first, second and third regions have different distances. For example, the first distance is larger than the second distance and the second distance is larger than the third distance.

FIG. 6 shows a flow diagram of a method for making a semiconductor device. In step 302 a workpiece is placed onto the chuck or wafer chuck in a plasma chamber. The workpiece may comprise a wafer, a substrate or other carriers. For example, the wafer may comprise a semiconductor substrate such as a silicon substrate, a germanium substrate or a compound semiconductor substrate such as SiGe, InP, GaAs, or the like. The wafer may comprise a bulk substrate or silicon on insulator (SOI). In some embodiments the wafer may comprise a material layer or a plurality of material layers on the substrate. The material layer may be a conductive layer such as a metal or a non-conductive layer such as an oxide or a nitride. The wafer overlies the first region of the chuck and at least a portion of the second region of the chuck.

A first RF power is generated by a first RF generator in the first region of the chuck (step 304) and a second RF power is generated by a second RF generator in the second region of the chuck (step 306). Both RF generators preferably but not necessarily deliver the very same frequency (e.g., 13.56 MHz) and preferably but not necessarily are phase-locked. Depending on the process, the RF power in the first region and the RF power in the second region may be the same or maybe different. For example, if the etch rates or deposition rates in the first region of the wafer are lower than in the second region of the wafer (without a power adjustment), the RF power of the first region is set to a higher value than the RF power of the second region. Conversely, if the etch rates or deposition rates in the first region of the wafer are higher than in the second region of the wafer (without a power adjustment), the RF power of the second region is set to a higher value than the RF power of the first region.

Next, in step 308, a material layer may be deposited or the wafer is etched using the two RF powers. For example, a material is deposited on the wafer forming a material layer. Alternatively, a structure is etched in a material layer on the wafer or a structure is etched in the wafer applying the two RF powers. The deposition of the material or the etch of the wafer may optionally be supported by an independent adjustment of heat, e.g., setting a first temperature in the first region and setting a second temperature in the second region in order to further increase uniformity of the deposited material or the uniformity of the etch.

The different RF power levels primarily influence the kinetic energy of the ions in the plasma via a build-up of a self-bias voltage near the wafer. In one embodiment the different RF power levels influence less the ion density in the plasma as it is the case with RF powered upper electrodes. Finally, at step 310, the processed wafer is removed from the chuck and the plasma chamber.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A chuck comprising:
    a first conductive region capacitively coupled to a first RF generator that is configured to generate a first RF power signal;
    a second conductive region capacitively coupled to a second RF generator different from the first RF power generator, the second RF generator being configured to generate a second RF power signal; and
    an insulation region that electrically insulates the first conductive region from the second conductive region.

2. The chuck according to claim 1, wherein the first conductive region is an inner region of the chuck, and wherein the second conductive region is an outer region of the chuck.

3. The chuck according to claim 2, wherein the first conductive region is disk shaped, and wherein the second conductive region is a concentric ring.

4. The chuck according to claim 1, further comprising:
    a third conductive region capacitively coupled to a third RF generator that is configured to generate a third RF power signal, wherein the third RF power generator is different from the first RF power generator and different from the second RF power generator; and
    a second insulated region that electrically insulates the second conductive region from the third conductive region.

5. A system comprising:
    a plasma chamber;
    a first electrode located in the plasma chamber; and
    a second electrode located in the plasma chamber and configured to receive a workpiece, wherein the second electrode comprises a first conductive region and a second conductive region that is electrically insulated from the first conductive region, wherein the first conductive region is capacitively coupled to a first RF generator that is configured to generate a first RF power and the second conductive region is capacitively coupled to a second RF generator that is configured to generate a second RF power, wherein the the second electrode comprises a major outer surface for receiving a wafer.

6. The system according to claim 5, wherein the first RF power is different from the second RF power.

7. The system according to claim 5, wherein the first conductive region is further configured to be set to a first temperature, and wherein the second conductive region is further configured to be set to a second temperature.

8. The system according to claim 5, further comprising the first RF power generator and the second RF power generator.

9. The system according to claim 8, wherein the first RF power and the second RF power are each about 500 W to 1000 W.

10. The system according to claim 8, wherein a first frequency of the first RF power and a second frequency of the second RF power are phase locked.

11. The system according to claim 10, wherein the first frequency of the first RF power and the second frequency of the second RF power are driven by a common local oscillator.

12. The system according to claim 10, wherein the first RF power generator and the second RF power generator are a combined power generator with a power splitter.

13. The system according to claim 10, wherein the first conductive region comprises a first center point, wherein the second conductive region comprises a second center point, and wherein the first center point and the second center point are on a common central axis extending away from the second electrode along a direction perpendicular to a major surface of the second electrode.

14. A system comprising:
a plasma chamber; and
a chuck comprising a first conductive region, a second conductive region disposed around the first conductive region and an insulation region disposed between the first conductive region and the second conductive region, wherein the first conductive region is capacitively coupled to a first RF generator that is configured to generate a first RF power and the second conductive region is capacitively coupled to a second RF generator that is configured to generate a second RF power.

15. The system according to claim 14, wherein the first conductive region is disk shaped, and wherein the second conductive region is a concentric ring.

16. The system according to claim 14, wherein the first conductive region is further configured to be set to a first temperature, and wherein the second conductive region is further configured to be set to a second temperature.

17. The system according to claim 14, further comprising the first RF power generator and the second RF power generator.

18. The system according to claim 17, wherein the first RF power and the second RF power are each about 500 W to 1000 W.

19. The system according to claim 17, wherein a first frequency of the first RF power and a second frequency of the second RF power are phase locked.

20. The system according to claim 19, wherein the first frequency of the first RF power and the second frequency of the second RF power are driven by a common local oscillator.

21. The system according to claim 14, wherein the first conductive region comprises a first center point, wherein the second conductive region comprises a second center point, and wherein the first center point and the second center point are on a common central axis extending away from the chuck along a direction perpendicular to a major surface of the chuck.

* * * * *